(12) United States Patent
Liu et al.

(10) Patent No.: US 8,105,955 B2
(45) Date of Patent: Jan. 31, 2012

(54) INTEGRATED CIRCUIT SYSTEM WITH CARBON AND NON-CARBON SILICON

(75) Inventors: Jin Ping Liu, Beacon, NY (US); Richard J. Murphy, Clinton Corners, NY (US); Anita Madan, Danbury, CT (US); Ashima B. Chakravarti, Hopewell, NY (US)

(73) Assignees: GLOBALFOUNDRIES Singapore Pte. Ltd., Singapore (SG); International Business Machines Corporation, Armonk, NY (US)

( * ) Notice: Subject to any disclaimer, the term of this patent is extended or adjusted under 35 U.S.C. 154(b) by 832 days.

(21) Appl. No.: 11/464,664

(22) Filed: Aug. 15, 2006

(65) Prior Publication Data

US 2008/0121926 A1    May 29, 2008

(51) Int. Cl.
*H01L 21/31* (2006.01)

(52) U.S. Cl. ........... 438/761; 438/41; 438/44; 438/416; 438/481; 257/E21.102; 257/E21.105; 257/E21.115; 117/79; 117/929

(58) Field of Classification Search .............. 438/41, 438/44, 416, 481, 761; 257/E21.102, E21.105, 257/E21.115; 117/79, 929
See application file for complete search history.

(56) References Cited

U.S. PATENT DOCUMENTS

| | | |
|---|---|---|
| 6,165,874 A | 12/2000 | Powell et al. |
| 6,273,950 B1 | 8/2001 | Kitabatake |
| 6,936,490 B2 | 8/2005 | Abe et al. |
| 6,995,396 B2 | 2/2006 | Takahashi et al. |
| 2005/0181627 A1 | 8/2005 | Kamata et al. |
| 2006/0115933 A1* | 6/2006 | Ye et al. .................. 438/139 |

* cited by examiner

*Primary Examiner* — Thanh V Pham
(74) *Attorney, Agent, or Firm* — Mikio Ishimaru

(57) ABSTRACT

An integrated circuit system includes a substrate, a carbon-containing silicon region over the substrate, a non-carbon-containing silicon region over the substrate, and a silicon-carbon region, including the non-carbon-containing silicon region and the carbon-containing silicon region.

20 Claims, 3 Drawing Sheets

INTEGRATED CIRCUIT SYSTEM WITH CARBON AND NON-CARBON SILICON

TECHNICAL FIELD

The present invention relates generally to integrated circuit system, and more particularly to a system for integrated circuits with carbon and non-carbon silicon.

BACKGROUND ART

An integrated circuit semiconductor is a small device filling the demands for more features and higher performance. Electronic devices touch virtually all aspects of our modern lives. The underlying technology to meet the demands of our modern life involves many tiny electronic circuits on a semiconductor die designed to respond and react to our world. As the breadth and scale of the products and applications continue to expand, so too the requirements and difficulties for these electronic circuits. Requirements for specialized circuitry continue to challenge the performance demands across many parameters, integrated circuit performance, as well as size.

Some of the more recent products and applications have challenged performance demands for much smaller devices and integrated circuits while maintaining high circuit performance. The need for high switching speeds with much smaller integrated circuit area and dimensions, include small systems and larger systems in industrial applications and consumer application. These needs, whether for small applications or large applications, demand attention, knowledge, creativity, and effort in discovering solutions appropriate to the often unique applications and products. Conventional semiconductors, such as silicon & GaAs, are unable to meet some of the increasing demands of products moving to smarter and higher electronic content systems.

Driven by the size reduction of integrated circuits, including reduction of the gate length and gate oxide thickness, improvement in speed performance, density, and cost per unit function of integrated circuits have continued over the past few decades. To enhance transistor performance further, strain may be introduced in the transistor channel for improving carrier mobilities. Therefore, strain-induced mobility enhancement is another way to improve transistor performance in addition to device scaling. There are several existing approaches of introducing strain in the transistor channel region. New materials are being developed to meet the diverse demands for high performance devices at smaller technologies. One of the more promising emerging semiconductors is silicon-carbon (Si:C).

While great advances have been made in recent years, significant fundamental materials problems severely hinder commercialization and beneficial system insertion of wide bandgap electronics. One of the most intransigent of these problems is the high structural defect density in silicon-carbon layers in which electronic devices are constructed. Another is the very rough surface structure of silicon-carbon, relative to silicon surfaces, with a lot of disruptions that inhibit the performance and reliability of various device structures. The rough surface structure is particularly detrimental to silicon-carbon-based metal oxide semiconductor field effect transistors (MOSFET's), the transistor of choice in the vast majority of all semiconductor chips produced today. This rough surface of silicon-carbon also degrades the quality of layers grown on the silicon-carbon, which nevertheless still yields the most promising devices reported to date.

A number of prior art processes have been developed that contribute somewhat to the solution of the problem of defects and the rough surfaces that are produced in current epitaxial film growth processes. However, each of these prior art processes has limitations and disadvantages.

Thus, a need still remains for an integrated circuit system with carbon and non-carbon silicon to suppress surface roughening and provide strain in the MOSFET's, thereby increasing performance, volume production, and manufacturing yield. In view of the increasing demand for improved integrated circuits and particularly with higher voltage, current, and, temperature, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a substrate, applying a carbon-containing silicon region over the substrate, applying a non-carbon-containing silicon region over the substrate, and forming a silicon-carbon region, including the non-carbon-containing silicon region and the carbon-containing silicon region.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
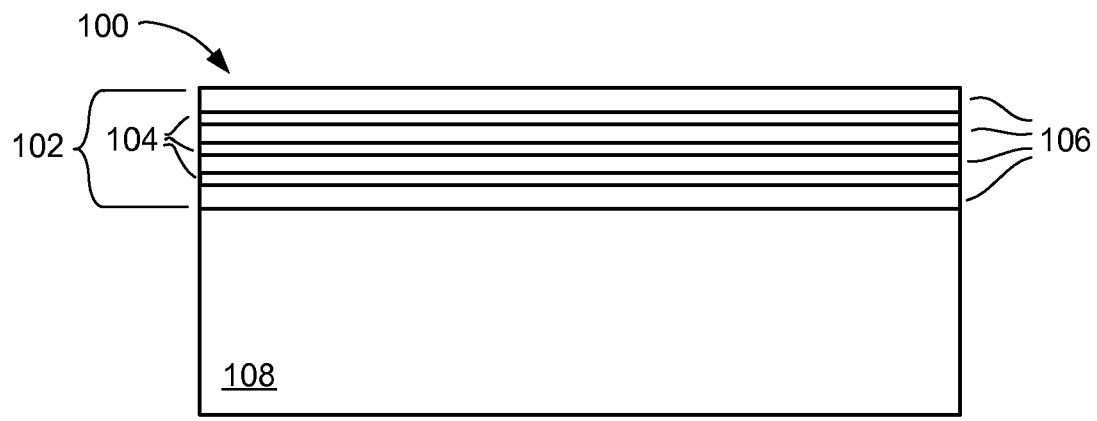
FIG. 1 is a cross-sectional view of an integrated circuit system in a substrate-forming phase in an embodiment of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material, patterning, exposure, development, etching, cleaning, and/or removal of the material or as required in forming a described structure.

Referring now to FIG. 1, therein is shown a cross-sectional view of an integrated circuit system 100 in a substrate-forming phase in an embodiment of the present invention. The integrated circuit system 100 includes a silicon-carbon region 102, such as an epitaxial region of SixC1-x, an epitaxial layer, or an epitaxy. A non-carbon-containing silicon region 104 and a carbon-containing silicon region 106 form the silicon-carbon region 102. The non-carbon-containing silicon region 104 can be formed by stopping a carbon source during epitaxy formation on a substrate 108, such as a silicon substrate.

The average strain in the epitaxy can be decreased by a silicon thickness, tSi, divided by the silicon-carbon thickness, tSiC, added to the silicon thickness and multiplied by one hundred percent.

$$tSi/(tSiC+tSi)*100\% = \text{percentage decrease of stress}$$

The percentage decrease of stress can be reduced by reducing the silicon thickness. Hydrogen chloride can be introduced during silicon epitaxial application to clean the surface without additional silicon deposition, which may be required for selective growth. The resulting percentage decrease of stress is provided by a silicon deposition thickness smaller than the silicon deposition with the additional carbon.

It has been discovered that the integrated circuit system 100 with the silicon-carbon region 102 provides epitaxy growth at over twenty-two hundredths of a percent carbon. Further, it has been discovered that the integrated circuit system 100 with the silicon-carbon region 102 provides epitaxy growth at over six hundred twenty-five degrees Celsius.

Figure 2:
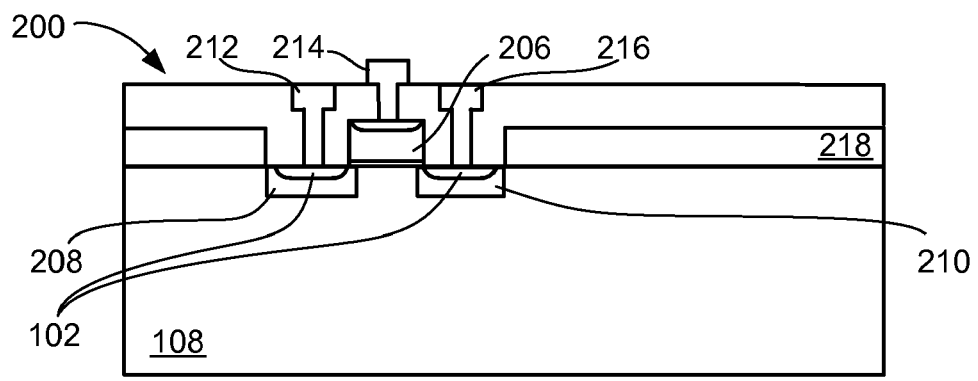
FIG. 2 is a cross-sectional view of an integrated circuit system in an alternative embodiment of the present invention.

Referring now to FIG. 2, therein is shown a cross-sectional view of an integrated circuit system 200 in an alternative embodiment of the present invention. The integrated circuit system 200, such as a metal oxide semiconductor field effect transistor, includes a gate 206 over the silicon-carbon region 102, a source 208 connected by a source contact 212, an oxide 218, a drain 210 connected by a drain contact 216, and the substrate 108. The metal oxide semiconductor field effect transistor with the silicon-carbon region 102 provides an epitaxial region for the metal oxide semiconductor field effect transistor.

It has been discovered that the integrated circuit system 200 with the silicon-carbon region 102 provides a strain region for the metal oxide semiconductor field effect transistor including stress in the source 208 and the drain 210.

Figure 3:
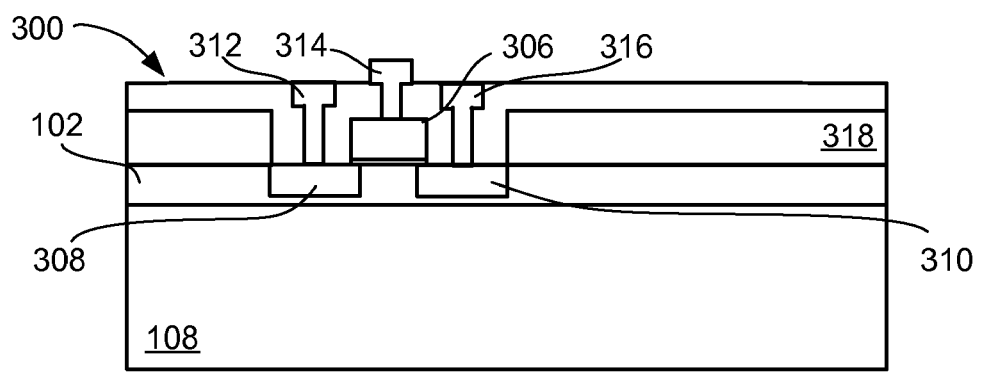
FIG. 3 is a cross-sectional view of an integrated circuit system in another alternative embodiment of the present invention.

Referring now to FIG. 3, therein is shown a cross-sectional view of an integrated circuit system 300 in another alternative embodiment of the present invention. The integrated circuit system 300, such as a metal oxide semiconductor field effect transistor, includes a gate 306 over the silicon-carbon region 102, a source 308 connected by a source contact 312, an oxide 318, a drain 310 connected by a drain contact 316, and the substrate 108. The metal oxide semiconductor field effect transistor with the silicon-carbon region 102 provides an epitaxial region for the metal oxide semiconductor field effect transistor.

It has been discovered that the integrated circuit system 300 with the silicon-carbon region 102 provides a strain region for the metal oxide semiconductor field effect transistor including stress in the source 308 and the drain 310.

Figure 4:
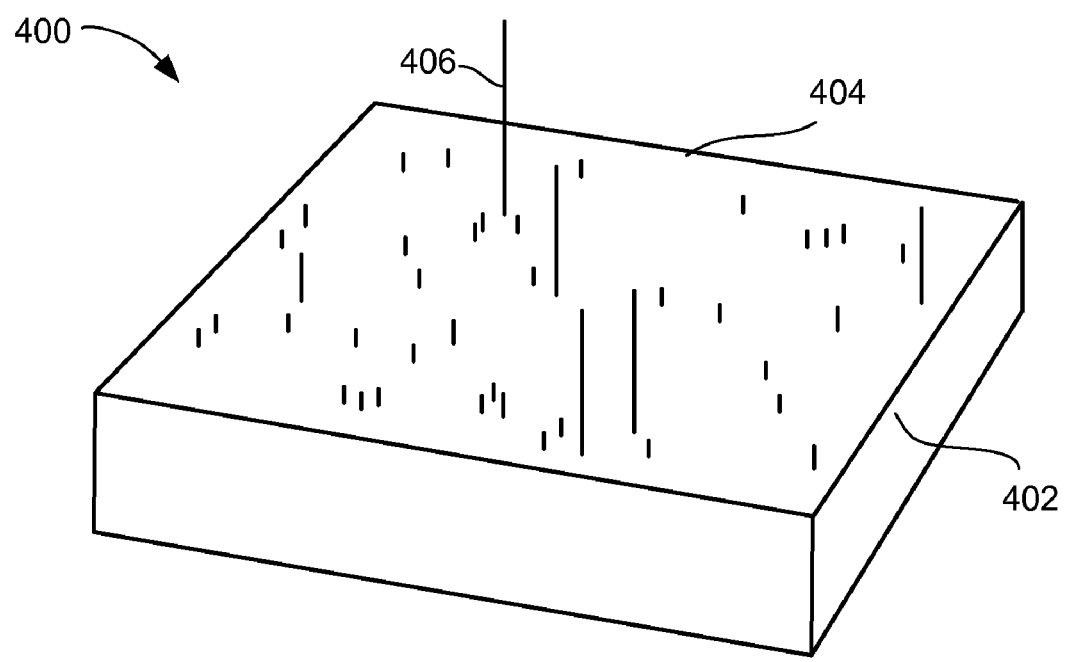
FIG. 4 is an isometric view of an integrated circuit system in a substrate-forming phase in yet another alternative embodiment of the present invention.

Referring now to FIG. 4, therein is shown an isometric view of an integrated circuit system 400 in a substrate-forming phase in yet another alternative embodiment of the present invention. The integrated circuit system 400 includes a silicon-carbon region 402 having a top surface 404 with disruptions 406. The non-carbon-containing silicon region 104 of FIG. 1 and the carbon-containing silicon region 106 of FIG. 1 form the silicon-carbon region 402. The non-carbon-containing silicon region 104 can be formed by stopping a carbon source during epitaxy formation. The silicon-carbon region 402 includes one region of the non-carbon-containing silicon region 104.

It has been discovered that the integrated circuit system 400 with the silicon-carbon region 402 having one of the non-carbon-containing silicon region 104 and the carbon-containing silicon regions 106 on top and bottom, as disclosed in FIG. 1, provides a few of the disruptions 406 of the top surface 404. In at least one embodiment, the top carbon-containing silicon region can be formed to include a top surface 404 of the integrated circuit system 400 that acts as the topmost or final layer or region along a boundary of the integrated circuit system 400.

Figure 5:
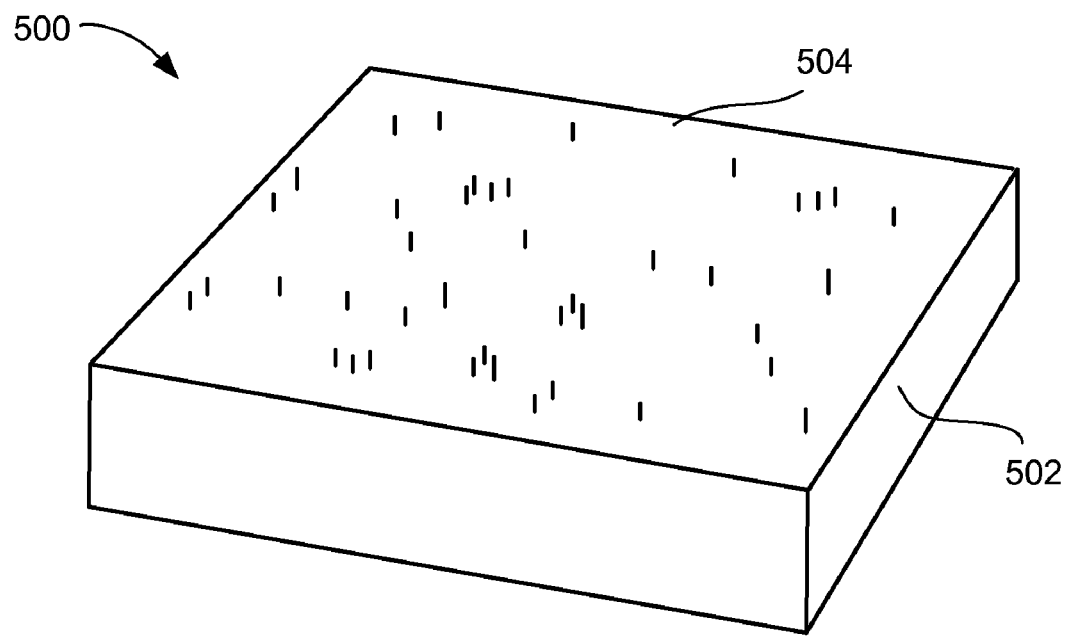
FIG. 5 is an isometric view of an integrated circuit system in a substrate-forming phase in yet another alternative embodiment of the present invention.

Referring now to FIG. 5, therein is shown an isometric view of an integrated circuit system 500 in a substrate-forming phase in yet another alternative embodiment of the present invention. The integrated circuit system 500 includes a silicon-carbon region 502 having a top surface 504. The non-carbon-containing silicon region 104 of FIG. 1 and the carbon-containing silicon region 106 of FIG. 1 form the silicon-carbon region 502. The non-carbon-containing silicon region 104 can be formed by stopping a carbon source during epitaxy formation. The silicon-carbon region 502 includes two of the non-carbon-containing silicon region 104.

It has been discovered that the integrated circuit system 500 with the silicon-carbon region 502 having two of the non-carbon-containing silicon region 104 provides the top surface 504 with almost none of the disruptions 406 of FIG. 4.

Figure 6:
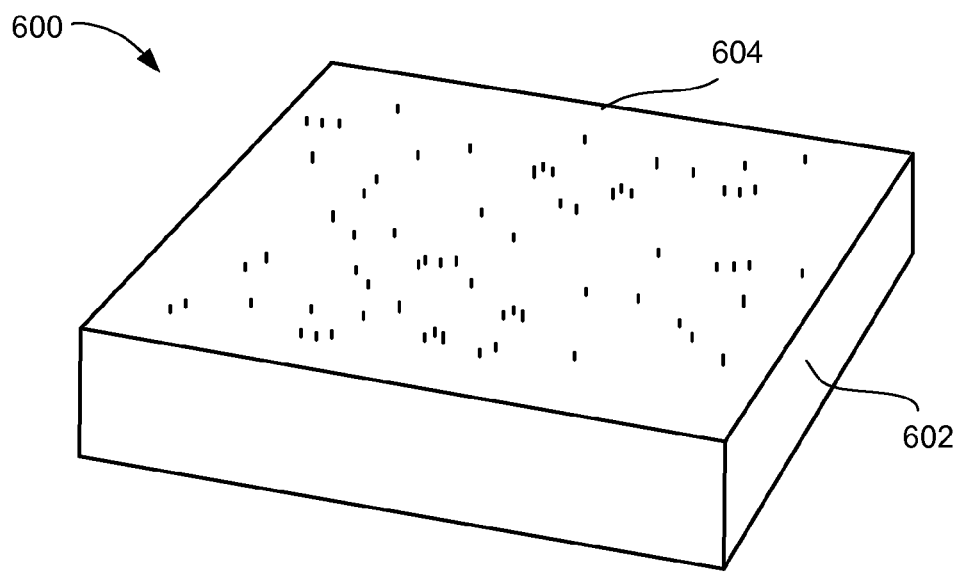
FIG. 6 is an isometric view of an integrated circuit system in a substrate-forming phase in yet another alternative embodiment of the present invention.

Referring now to FIG. 6, therein is shown an isometric view of an integrated circuit system 600 in a substrate-forming phase in yet another alternative embodiment of the present invention. The integrated circuit system 600 includes a silicon-carbon region 602 having a top surface 604. The non-carbon-containing silicon region 104 of FIG. 1 and the carbon-containing silicon region 106 of FIG. 1 form the silicon-carbon region 602. The non-carbon-containing silicon region 104 can be formed by stopping a carbon source during epitaxy formation. The silicon-carbon region 602 includes four of the non-carbon-containing silicon region 104.

It has been discovered that the integrated circuit system 600 with the silicon-carbon region 602 having four of the non-carbon-containing silicon region 104 provides the top surface 604 with almost none of the disruptions 406 of FIG. 4.

Figure 7:
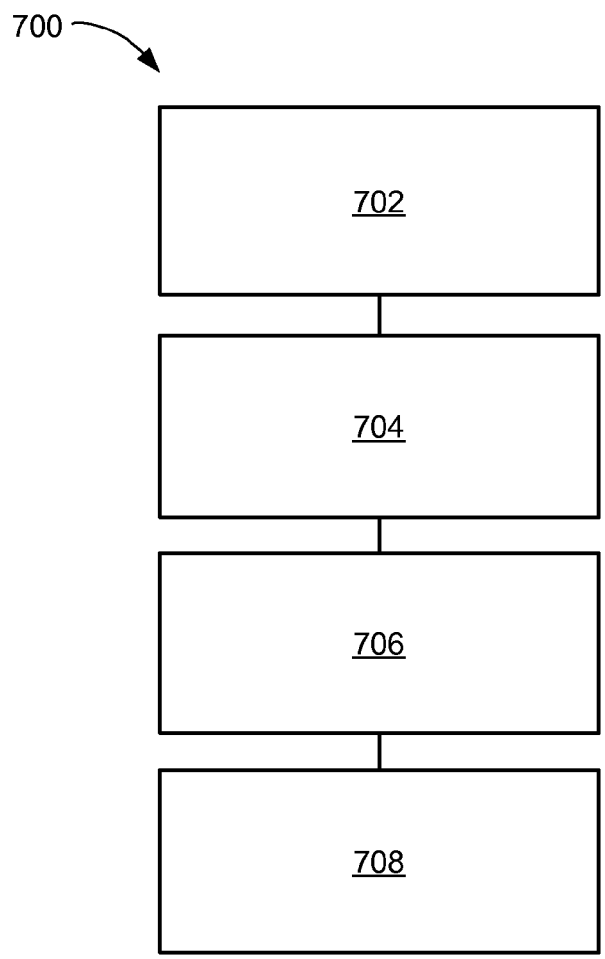
FIG. 7 is a flow chart of an integrated circuit system for manufacturing the integrated circuit system in an embodiment of the present invention.

Referring now to FIG. 7 is a flow chart of an integrated circuit system 700 for manufacturing the integrated circuit system 100 in an embodiment of the present invention. The system 700 includes providing a substrate in a block 702; applying a carbon-containing silicon region over the substrate in a block 704; applying a non-carbon-containing silicon region over the substrate in a block 706; and forming a silicon-carbon region, including the non-carbon-containing silicon region and the carbon-containing silicon region in a block 708.

In greater detail, a method to fabricate the integrated circuit system 100, in an embodiment of the present invention, is performed as follows:

1. Providing a substrate for integrated circuits. (FIG. 1)
2. Depositing a carbon-containing silicon region for an epitaxial layer on the substrate. (FIG. 1)
3. Depositing a non-carbon-containing silicon region for the epitaxial layer on the substrate. (FIG. 1)
4. Forming a silicon-carbon region, including the non-carbon-containing silicon region and the carbon-containing silicon region with substantially no disruptions. (FIG. 1)

It has been discovered that the present invention thus has numerous aspects.

An aspect is that the present invention provides a silicon-carbon substrate. The silicon-carbon substrate can introduce stress in channels and improve device performance.

Another aspect is that the present invention provides thin epitaxial layers without carbon. The silicon-carbon substrate includes regions of epitaxy that do not contain carbon. The carbon content variation can provide layers of the epitaxy and can range from one layer without carbon to many layers.

It has been discovered that the disclosed structure suppresses surface roughening of the epitaxy. The surface of the epitaxial region does not contain significant epitaxial disruptions or significant numbers of epitaxial disruptions resulting in an epitaxial surface that is substantially smooth.

It has also been discovered that the disclosed structure allows higher carbon content in the formation of the epitaxial layer. The higher carbon content significantly improves the performance and integrity of the epitaxy. The epitaxial surface can be substantially smooth with the higher carbon content.

Yet another discovery is that the disclosed structure allows higher temperatures during formation of the epitaxial layer. The higher temperatures provide higher growth rates during epitaxial formation. The epitaxial surface can be substantially smooth at temperatures above six hundred twenty-five degrees.

Yet another discovery is that the disclosed structure provides integrity of epitaxy. The epitaxy can provide a consistent epitaxial layer including thickness and smoothness. The thick and smooth epitaxy can be formed with high carbon content and high temperatures having high growth rates.

Yet another discovery is that the disclosed structure provides integration of the epitaxy. The substantially smooth and consistent layer allows substantially uniform integration of the epitaxial layer with the substrate and adjacent materials. The integrated circuits are formed with substantially consistent dimensions and performance.

Yet another discovery is that the disclosed structure strain in the epitaxial layer. The strain in the epitaxial layer induces stress in the source and drain regions. The stress in the source and drain regions improves performance of the integrated circuit including mobility of carriers in the channel.

Yet another discovery is that the disclosed structure provides tunability of epitaxy process selectivity. The silicon-carbon region allows control over carbon and silicon during the epitaxy formation. Carbon content as well as the quantity and extent of the non-carbon-containing silicon can be controlled.

Yet another discovery is that the disclosed structure is compatibility with volume manufacturing. The control over carbon content as well as quantity and extent of the non-carbon-containing silicon provides control over high volume production variations. The methods and apparatus are also compatible with volume production.

These and other valuable aspects of the present invention consequently further the state of the technology to at least the next level.

Thus, it has been discovered that the integrated circuit system with carbon and non-carbon silicon method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit system comprising:
   providing a substrate;
   applying an even number of carbon-containing silicon layers over the substrate;
   applying an odd number of non-carbon-containing silicon layers over the substrate; and
   forming a silicon-carbon region, including the carbon-containing silicon regions on bottom and top of each of the non-carbon-containing silicon layers with substantially no disruptions on the top carbon-containing silicon region; and layer, the top carbon-containing silicon layer including a top surface of the integrated circuit system.

2. The method as claimed in claim 1 wherein forming the silicon-carbon region includes fanning the non-carbon-containing silicon layers in thin layers.

3. The method as claimed in claim 1 wherein applying the carbon-containing silicon layers includes applying a silicon source and a carbon source.

4. The method as claimed in claim 1 wherein applying the non-carbon-containing silicones layers includes stopping a carbon source.

5. The method as claimed in claim 1 wherein forming the silicon-carbon region includes applying hydrogen chloride to clean the silicon-carbon region.

6. A method for manufacturing an integrated circuit system comprising:
   providing a substrate for integrated circuits;
   depositing an even number of carbon-containing silicon layers for an epitaxial layer on the substrate;
   depositing an odd number of non-carbon-containing silicon layers for the epitaxial layer on the substrate; and
   forming a silicon-carbon region, including the carbon-containing silicon layers on bottom and top of each of the non-carbon-containing silicon layers with substantially no disruptions on the top carbon-containing silicon region; and layer, the top carbon-containing silicon layer including a top surface of the integrated circuit system.

7. The method as claimed in claim 6 wherein forming the silicon-carbon region includes forming the carbon-containing silicon layers substantially contiguous with the non-carbon-containing silicon layers.

8. The method as claimed in claim 6 wherein forming the silicon-carbon region includes forming the silicon-carbon region with over twenty-two hundredths of a percent carbon.

9. The method as claimed in claim 6 wherein depositing the carbon-containing silicon layers includes applying carbon and silicon.

10. The method as claimed in claim 6 wherein forming the silicon-carbon region includes forming a single epitaxial film.

11. An integrated circuit system comprising:
a substrate;
an even number of carbon-containing silicon layers over the substrate;
an odd number of non-carbon-containing silicon layers over the substrate;
a silicon-carbon region, including the carbon-containing silicon layers on bottom and top of each of the non-carbon-containing silicon layers with substantially no disruptions on the top carbon-containing silicon layer and the top carbon-containing silicon layer including a top surface of the integrated circuit system.

12. The system as claimed in claim 11 wherein the silicon-carbon region includes the non-carbon-containing silicon layers in thin layers.

13. The system as claimed in claim 11 wherein the carbon-containing silicon layers include only silicon and carbon.

14. The system as claimed in claim 11 wherein the non-carbon-containing silicon layers include only silicon and substantially no carbon.

15. The system as claimed in claim 11 wherein the silicon-carbon region is substantially clean.

16. The system as claimed in claim 11 wherein:
the substrate is for integrated circuits;
the carbon-containing silicon layers are formed as an epitaxial layer on the substrate; and
the non-carbon-containing silicon layers are formed as an epitaxial layer.

17. The system as claimed in claim 16 wherein the carbon-containing silicon layers are substantially contiguous with the non-carbon-containing silicon layers.

18. The system as claimed in claim 16 wherein the silicon-carbon region includes the silicon-carbon region with over twenty-two hundredths of a percent carbon.

19. The system as claimed in claim 16 wherein the carbon-containing silicon layers include only carbon and silicon.

20. The system as claimed in claim 16 wherein the silicon-carbon region is formed into a single epitaxial film.

* * * * *